United States Patent [19]

Ogawa et al.

[11] Patent Number: 5,118,028
[45] Date of Patent: Jun. 2, 1992

[54] DIFFUSION BONDING METHOD FOR CORROSION-RESISTANT MATERIALS

[75] Inventors: Kazuhiro Ogawa; Yuichi Komizo, both of Nishinomiya, Japan

[73] Assignee: Sumitomo Metal Industries, Ltd., Osaka, Japan

[21] Appl. No.: 573,721

[22] Filed: Aug. 28, 1990

[30] Foreign Application Priority Data

Aug. 29, 1989 [JP] Japan .................... 1-222297
Feb. 13, 1990 [JP] Japan .................... 2-33218

[51] Int. Cl.$^5$ .................................... B23K 20/00
[52] U.S. Cl. ........................ 228/194; 228/263.15
[58] Field of Search .................. 228/194, 263.15; 219/9.5, 78.02, 85.11

[56] References Cited

U.S. PATENT DOCUMENTS

| | | | |
|---|---|---|---|
| 2,886,690 | 5/1959 | Crawford | 219/85.11 X |
| 3,158,732 | 11/1964 | Kazakov | 219/9.5 X |
| 3,632,319 | 1/1972 | Hoppin | 228/194 |
| 3,753,794 | 8/1973 | Paulonis et al. | |
| 3,963,163 | 6/1976 | Oshida | 228/196 |
| 4,150,776 | 4/1979 | Lesgourgues | 228/194 |
| 4,516,716 | 5/1985 | Coad | 228/263.15 |
| 4,640,454 | 2/1987 | Yamamoto et al. | 228/193 X |
| 4,795,078 | 1/1989 | Kuroki et al. | 228/155 X |
| 4,795,610 | 1/1989 | Culling | 420/587 X |

FOREIGN PATENT DOCUMENTS

| | | |
|---|---|---|
| 108959 | 5/1984 | European Pat. Off. |
| 123702 | 11/1984 | European Pat. Off. |
| 114483 | 3/1980 | Japan ........... 228/194 |
| 55-57389 | 4/1980 | Japan . |
| 2100641 | 1/1983 | United Kingdom . |

OTHER PUBLICATIONS

E. Lugscheider et al., "Metallurgical Aspects of Additive-Aided Wide-Clearance Brazing With Nickel-Based Filler Metals," Welding Journal, vol. 68, No. 1, Jan. 1989, pp. 9S, 11s and 13S.
Chemical Abstracts, vol. 103, No. 5, Sep. 1985, Abstract No. 74659p, p. 217.

Primary Examiner—Richard K. Seidel
Assistant Examiner—Patty E. Hong
Attorney, Agent, or Firm—Burns, Doane, Swecker & Mathis

[57] ABSTRACT

A diffusion bonding method for corrosion resistant materials comprises: disposing an insert material having a melting point of at most 1150 degrees C. and a thickness of 10-80 micrometers between the bonding interfaces of two members to be joined, the insert comprising, by weight %, Cr: 5-40%, one or more of Si: at most 8% and B: at most 4%, and a remainder of at least one of Fe and Ni and incidental impurities; and heating the bonding interfaces of the two members by high-frequency induction heating for at least 120 seconds at a temperature of 1150-1250 degrees C. in an atmosphere containing at most 200 ppm oxygen while applying a pressure of 0.5-2 kgf/mm$^2$ to the bonding interfaces so as to melt the insert material.

26 Claims, 2 Drawing Sheets

DIFFUSION BONDING METHOD FOR CORROSION-RESISTANT MATERIALS

BACKGROUND OF THE INVENTION

This invention relates to a diffusion bonding method for corrosion-resistant materials. More particularly, it relates to a diffusion bonding method for Ni base or Fe base high alloy corrosion-resistant materials.

There are many Ni base or Fe base high alloy corrosion resistant materials. These materials exhibit excellent corrosion resistance due to a high content of Ni and/or Cr and are able to withstand relatively severe corrosive environments. When these materials are used as construction materials, they are frequently joined by welding. However, when welding high-alloy materials, weld cracks are inevitable.

Among the most typical high alloy corrosion resistant materials which suffer from weld cracks are Ni base and Fe base corrosion resistant materials, such as those used for high temperature equipment, and Ni base and Fe base clad steel tubes using stainless steel or a high alloy as a cladding material.

In thermal power stations, nuclear power stations, and chemical plants, many types of equipment must be operated at high temperatures. The materials used for such high temperature equipment must have many different properties, including resistance to oxidation by steam, high temperature corrosion resistance, high temperature strength, creep rupture strength, and good fatigue strength. For example, a cracking tube for use in equipment for the manufacture of ethylene is used at a temperature of 800 degrees C. or higher, so it must have high temperature corrosion resistance and excellent creep rupture strength.

High alloy materials for such high temperature equipment have conventionally been joined to one another by welding. However, as these materials have a high carbon content or they contain a large number of alloying elements, they are highly susceptible to weld cracking, and it is difficult to avoid a decrease in the high temperature strength of the welded joint. TIG welding, in which the amount of heat applied during welding is suppressed, has been much used for welding such materials, but weld cracking can still not be completely prevented, and the welding efficiency of TIG welding should be low to avoid the occurrence of weld crackings.

Chemical plants and pipelines frequently use so-called stainless steel clad tubes with an inner tube (cladding) of stainless steel for transporting corrosive liquids. These clad tubes are formed by combining an outer tube of low alloy steel or carbon steel with an inner tube of stainless steel to form a clad assembly. The inner tube of stainless steel provides corrosion resistance against the liquid flowing through the assembly, while the outer tube of low alloy steel or carbon steel gives the clad assembly the required strength. Stainless clad steel tubes of this type have been found to be economical and practical. Stainless clad steel tubes having an inner tube of low alloy steel or carbon steel and an outer tube of stainless steel are also frequently employed in chemical plants and the like when only the outside of the clad assembly requires corrosion resistance.

However, when stainless clad steel tubes are joined by conventional welding methods, various problems occur, so it is necessary to exercise special care when welding these materials. For example, Japanese Published Unexamined Patent Application No. 58-167094 discloses a welding method for a multi-layer tube in which a different welding material is used for each layer.

However, even when such a welding method is employed, it is very difficult to perform circumferential welding of clad steel tube. Some of the problems of performing a circumferential weld on a stainless clad steel tube having a stainless steel tube on the inner surface of the clad assembly will be described below.

Circumferential welding of a steel tube is normally carried out from the outside of the tube, and metal having a similar composition as the tube is used as the welding material. However, when steel tube with internal stainless cladding is welded from the outside by single-side welding, if a stainless steel welding material is used to weld the internal cladding and carbon steel welding material is used to weld the external base metal, when the base metal is welded, a portion of the stainless steel welding metal for the internal cladding, which has already been welded, is remelted. The remelted stainless steel welding metal is diluted by the carbon steel welding metal and solidifies to form a hardened layer. As a result, cracks form in the weld portion, and depending on the composition of the stainless steel, weld cold cracks and hot cracks are formed. On the other hand, when a high-alloy welding material is used to weld both the inner and outer tubes, there is the possibility of insufficient weld strength. Furthermore, stainless steel appears on the outer surface of the outer tube, causing galvanic corrosion due t the contact of the stainless steel and the carbon steel.

Even if a welding method like that disclosed in Japanese Published Unexamined Patent Application No. 58-167094 is employed, the welding material and welding conditions must be successively changed for the inner layer, the intermediate layer, and the outer layer, so welding becomes complicated. Furthermore, in that method, the soundness of the weld depends on the skill of the welder, so the weld quality is highly variable. A bigger problem is that in order to prevent weld defects, it is necessary to restrict the welding speed, so the efficiency of welding is extremely poor.

Another method which can be used to join high alloy corrosion resistant materials is diffusion bonding. Diffusion bonding has the advantages that it produces almost no deformation during bonding and that heat effects are small. However, conventional diffusion bonding methods have the drawbacks that they are very time consuming and inefficient. Moreover, since diffusion bonding must often be carried out under a vacuum, equipment costs tend to be high.

SUMMARY OF THE INVENTION

It is an object of the present invention to provide a bonding method for high alloy corrosion resistant materials which can be efficiently and easily carried out.

Another object of the present invention is to provide a bonding method for materials for high temperature equipment which can impart to the joint the properties required for high alloy corrosion resistant materials for high temperature equipment.

Still another object of the present invention is to provide a method which can easily join stainless or high alloy clad steel tube and provide a sound joint with high efficiency.

The present inventors have noted the above-mentioned advantages of diffusion bonding. In the prior it has been thought that diffusion bonding is not effective for improving corrosion resistance since different materials are used as an insert material resulting in a deterioration in corrosion resistance. The inventors tested an application of diffusion bonding to high alloy corrosion resistance materials for improving corrosion resistance, and found that it was necessary to perform homogenizing diffusion by heating for a longer period than usual. This means that conventional diffusion bonding is not advantageous from a practical viewpoint.

Then the present inventors tried liquid phase diffusion bonding. Unexpectedly, due to liquid phase diffusion, using an insert material with a strictly-limited composition and thickness, for the first time it was possible to easily and efficiently perform bonding of high alloy corrosion resistant materials with improved corrosion resistance.

However, particularly in the case of high-alloy corrosion resistant materials for high temperature equipment, the temperature for melting the insert material is high, so hot cracks occur in the joint just as in the case of melting, and it is not easy to prevent hot cracking with diffusion bonding, either.

In the case of stainless clad steel tube, in addition to the problems of cold and hot cracks, it is still difficult to carry out liquid phase diffusion bonding with high efficiency and at the same time obtain a joint with good corrosion resistance.

The present inventors performed various experiments in order to solve such problems. As a result, the following discoveries were made concerning diffusion bonding of materials for high temperature equipment and particularly of materials for use at a temperature of 700 degrees C. or higher.

In order to prevent hot cracks during diffusion bonding of materials for high temperature equipment, it is necessary to restrain the melting temperature of the insert material to no higher than 1150 degrees C. Such an insert material can be obtained by addition of at least one of Si and B. If Cr and Mo are also added in addition thereto to at least one of Si and B, the resistance to high temperature oxidation and high temperature strength of the joint are remarkably improved. These elements are sufficiently diffused and exhibit effectiveness by heating for at least 120 seconds. The interface with the insert material guarantees adhesion, so a certain amount of thickness is necessary, but if it is too thick, the creep rupture strength and the resistance to high temperature oxidation of the joint decrease.

Accordingly, the present invention is a diffusion bonding method for corrosion resistant materials comprising the steps of disposing an insert material having a melting point of at most 1150 degrees C. and a thickness of 10–80 micrometers and comprising an alloy composition of, by weight %, Cr in an amount of 5–40%, at least one of Si in an amount of at most 8% and B in an amount of at most 4%, and a remainder of one or more of Fe and Ni and incidental impurities at the interface of materials to be joined, heating the abutting portions by induction heating with a high-frequency power source to a temperature of 1150–1250 degrees C. for at least 120 seconds while applying a pressure of 0.5–2 kgf/mm$^2$ in an atmosphere containing at most 200 ppm of oxygen, and melting the insert material.

The insert material may also comprise at most 10% of Mo.

According to a preferred mode of the present invention, the corrosion resistant material to be joined is a material for high temperature equipment comprising, by weight %, C: 0.05–0.5%,
Si: 1–2.5%
Mn: 0.1–1.5%,
Ni: 20–45%,
Cr 22–30%, optionally one or more of Mo: 1.8–2.2%, Ti: 0.2–0.8%, B: 0.002–007%, and Zr: 0.01–0.05%, and a remainder of Fe and incidental impurities.

According to another mode, the corrosion resistant material to be joined is a clad steel tube having an outer tube of carbon steel or low alloy steel and an inner tube of stainless steel or high Ni alloy steel. In this case, it is preferable that the materials to be joined be heated by induction heating using a high-frequency power supply of 2–400 kHz.

Alternatively, the clad steel tube may comprise an outer tube of stainless steel or high Ni alloy steel and an inner tube of carbon steel or low alloy steel. In this case, the materials to be joined are preferably heated by induction heating using a high-frequency power supply of at most 10 kHz.

The present invention is aimed at bonding high alloy corrosion resistant materials of which corrosion resistance is required. The insert therefore has a thickness of 10–80 micrometers, and by making the bonding time at least 120 seconds, the formation of a (Cr,Mo)-depleted zone can be avoided, and a deterioration in corrosion resistance can be prevented. By employing diffusion bonding which was not employed conventionally in order to maintain corrosion resistance, it was found that bonding of high alloy corrosion resistant materials is possible, and it must be said that the effects of this invention are totally unexpected.

Japanese Published Unexamined Patent Application No. 55-57389 discloses a bonding method for iron alloy parts using an insert having at least one of Fe, Ni, and Co as a main component and further containing B, Si, and if necessary Cr. However, in that method, the insert material is comparatively thick with a thickness of 0.1–1 mm, and by applying a compressive force during bonding of at least 3 kgf/mm$^2$, the melted insert material is eliminated to the outside together with B$_2$O$_3$ and SiO$_2$ which are formed during bonding.

However, the research results of the present inventors show that if liquid phase diffusion bonding with a reduced compressive force is carried out by such a method, a fairly thick border layer remains and a (Cr,Mo)-depleted zone is formed in which corrosion is inevitable, and that without reducing the compressive force a remarkable degree of deformation appears in the joint.

According to the present invention it is also advantageous that when a longitudinal thermal expansion produced by the induction heating is restrained, materials to be bonded can be upset without application of any external forces.

DESCRIPTION OF THE PREFERRED EMBODIMENTS

Herebelow, the reasons for the restrictions on the bonding method of the present invention will be described. Unless otherwise specified, % refers to % by weight.

Insert Material

The insert material used for bonding has the following composition and a melting point of at most 1150 degrees C. If the melting point of the insert material exceeds 1150 degrees C., the heating temperature of the materials at the time of bonding becomes high, and there is the possibility of hot cracks and loss of economical advantages.

Si, B

At least one of these elements is necessary in order to lower the melting point of the insert material. The lower limit on these materials is the level such that the melting point is at most 1150 degrees C. These elements easily diffuse into the parent metal. However, if present in large amounts, they can no longer prevent embrittlement of the joint.

Accordingly, the upper limit on Si is 8% and the upper limit on B is 4%. Si and B are added in order to lower the melting point. It is preferable to add them in combination rather than singly. Preferred ranges of these elements are 2–8 % for Si and 0.1–2 % for B.

Cr

The addition of Cr increases the resistance to high temperature oxidation of the joint. However, it is not effective if present in an amount of less than 5%, while if it exceeds 40%, it causes embrittlement of the joint. Accordingly, the limits on Cr are preferably 5–40% and more preferably 15–30 %.

Mo

Mo can be added if necessary to improve the corrosion resistance and the high temperature strength of the joint. However, if present in too large amounts, it produces embrittlement of the joint. Therefore, its content is limited to at most 10%. If added, its content is preferably 1–7 %.

The insert material can be a Ni base or an Fe base material, or it can contain both Fe and Ni. However, to obtain a joint with good corrosion resistance, it is preferable that the insert material be Ni base or have a high content of Ni. The insert material preferably has a noncrystalline structure. Even if the insert material has the above-described chemical composition, it is easy to lower the thickness by making a thin foil of a non-crystalline structure directly from molten metal, and its manufacture becomes easier and more economical.

If the thickness of the insert material is less than 10 micrometers, the irregularities in the bonding surfaces can not be absorbed and good adhesion at the interface between the members being joined can not be obtained. On the other hand, if the thickness is greater than 80 micrometers, a joint having adequate strength and resistance to high temperature oxidation can not be obtained in a short length of time. This is because as the thickness of the insert material increases, during the bonding operation, the elements in the insert material can not adequately diffuse in a short length of time, and the Si and B remaining in the joint cause embrittlement.

Bonding Conditions

Among the bonding conditions, the oxygen content of the atmosphere surrounding the joint, the bonding temperature, the applied pressure, the length of time for which bonding is carried out, and the frequency of induction heating are important. The limits on these parameters are given below.

Oxygen content of the bonding atmosphere

In order to prevent a decrease in joint strength due to oxidation of the joint interface, it is necessary to make low the oxygen content in the atmosphere surrounding the joint. If the oxygen content exceeds 200 ppm, the joint strength decreases due to oxidation.

Bonding Temperature

If the bonding temperature is lower than 1150 degrees C., there are cases in which the insert material can not be melted. Furthermore, even if the insert material can be melted, the diffusion of elements (Si, B), that lower the melting point, from the insert material into the parent metal is not sufficient or the time required for diffusion becomes too long, resulting in inefficiency. On the other hand, if the bonding temperature is too high, there is a danger of hot cracking, and the grain size in the vicinity of the joint coarsens and causes a decrease in strength. Therefore, the bonding temperature is preferably 1150–1250 degrees C.

Bonding Pressure

The pressure applied to the surfaces to be bonded can be at least 0.5 kgf/mm$^2$ in order to maintain the adhesion of the joint interface. However, if the pressure exceeds 2 kgf/mm$^2$, significant deformation of the joint can take place. Therefore, the bonding pressure is preferably 0.5–2 kgf/mm$^2$. The bonding pressure can be given by the application of external forces or by means of restraining the thermal expansion in a longitudinal direction of materials being bonded, which occurs during bonding.

Bonding Time

The bonding time is restricted to be at least 120 seconds in order to obtain good adhesion between the surfaces being joined, to obtain adequate diffusion of elements which lower the melting point (B and Si) and to guarantee the strength and corrosion resistance of the joint. There is no particular upper limit on the bonding time, but from the standpoint of economy, the shorter the bonding time the better, as long as the bonding time is sufficient to promote diffusion. Preferably, the bonding time is 600 seconds or less.

Frequency of Induction Heating

The present invention uses high-frequency induction heating to heat the vicinity of the bonding interface from the outside. There is no particular limit on the frequency. However, when bonding high alloy materials, if the heating frequency is less than 2 kHz, the heating efficiency is low and the heating becomes uneconomical. On the other hand, if the frequency exceeds 400 kHz, particularly when bonding stainless clad steel tubes, the skin effect becomes significant, so when bonding tubes, for example, it becomes difficult to uniformly heat and melt the insert material. Accordingly, the heating frequency is preferably 2–400 kHz and more preferably 2–20 kHz.

In the below-described embodiments of the present invention, stainless clad steel tube is used as a high-alloy corrosion resistant material for high temperature equipment. The composition of the high alloy corrosion resistant material for use in the present invention will be described below.

Materials to be Joined (parent materials)

There is no particular restriction on the high alloy materials which can be joined by the method of the present invention. However, according to a preferred mode of the invention, the materials have the following composition by weight %:
C: 0.05–0.5%,
Si: 1–2.5%,
Mn: 0.1–1.5%,
Ni: 20–45%,
Cr: 22–30%,
optionally one or more of Mo: 1.8–2.2%, Ti: 0.2–0.8%, B: 0.002–0.007%, and Zr: 0.01–0.05%, and
a remainder of Fe and incidental impurities.

The reasons for these limits on the chemical composition are as follows.

C

The carbon content is preferably at least 0.05% to insure strength. If the carbon content exceeds 0.5%, embrittlement occurs due to precipitation of carbides. Therefore, the amount of C is preferably 0.05–0.5% and more preferably 0.05–0.2 %.

Si

Si is preferably present in an amount of at least 1% in order to maintain resistance to high temperature oxidation and resistance to carburization. However, if the Si content exceeds 2.5%, cracks develop during hot working due to low melting point eutectics, so the upper limit on the Si content is 2.5%. Preferably, the Si content is 2% or less.

Mn

Mn is a deoxidizing element, and must be present in an amount of at least 0.1%. However, if its content is too high, hot workability is decreased. Therefore, the upper limit on the Mn content is preferably 1.5%.

Ni

The Ni content is at least 20% in order to guarantee stability of an austenite phase at high temperatures. For reasons of economy, the upper limit on its content is 45%. Preferably, the Ni content is 30–40%.

Cr

Cr is effective for maintaining resistance to high temperature oxidation. It is effective in amounts of at least 22%. However, if the Cr content exceeds 30%, it becomes difficult to maintain hot workability. Therefore, the Cr content is 22–30% and preferably 22–27%.

Mo, Ti, B, and Zr

These elements are effective for maintaining creep strength. Mo, Ti, and Zr increase creep strength by strengthening grain boundaries, and B increases creep strength by improving ductility. However, the effectiveness depends upon the element. Furthermore, if the amount of any of these elements is too large, the hot workability decreases. Therefore, the limits on these elements are 1.8–2.2% for Mo, 0.2–0.8% for Ti, 0.002–0.007% for B, and 0.01–0.05% for Zr.

In addition to the above elements, Al may also be added, preferably in an amount of 0.005–0.2%.

A high alloy corrosion resistant material having the above-described composition can be extruded to form a forged tube having the same strength as a centrifugally cast tube. The resulting tube exhibits the corrosion resistance and mechanical strength necessary for high temperature equipment, particularly at a temperature of above 700 degrees C.

Alternatively, the above-described corrosion resistant material can be employed in a stainless clad steel tube to which the bonding method of the present invention can be applied.

First, the heating conditions will be described for an internally clad steel tube having an outer tube of carbon steel or low alloy steel which serves as a base metal, and an inner tube of stainless steel or high-Ni alloy steel which serves as a cladding material.

When two steel tubes are abutted and joined by high-frequency heating, the skin effect caused by high-frequency waves causes heat to concentrate in the outer surface of the steel tubes. Therefore, when bonding internally clad steel tubes, the outer tube of carbon steel or low alloy steel is heated to a higher temperature than the inner tube of stainless steel or high Ni alloy steel due to the higher thermal conductivity of the outer tube. Therefore, by heating at a high frequency of 2–400 kHz, it is possible to heat to a temperature at which the outer and inner tubes can be joined, and the insert material can be adequately melted. If the frequency is less than 2 kHz, the skin effect is too small and the inner tube is heated more rapidly than the outer tube, and due to the high thermal conductivity of the outer tube of carbon steel or low alloy steel, the inner tube of stainless steel or high Ni alloy steel can be overheated and can melt and drop off. On the other hand, if the frequency exceeds 400 kHz, the skin effect in the outer tube becomes large, so only the outer tube is heated without the inner tube being heated, the insert material is not adequately melted, and a suitable joint can not be obtained.

Accordingly, when bonding an internally clad steel tube with an outer tube of carbon steel or low alloy steel and an inner tube of stainless steel or high Ni alloy steel, the heating frequency is set at 2–400 kHz.

Next, the heating conditions will be described for an externally clad steel tube having an outer tube of stainless steel or high Ni alloy steel and an inner tube of carbon steel or low alloy steel.

In this case, heating is performed at a high frequency of at most 10 kHz. If the heating frequency exceeds 10 kHz, due to the skin effect and the difference in thermal conductivities between the inner and outer tubes, only the outer tube is heated, the heating of the inner tube is inadequate, and the insert material is not sufficiently melted, so a suitable joint can not be obtained.

There is no particular lower limit on the heating frequency, but from the standpoint of economy, it is preferably at least 0.5 kHz.

EXAMPLES

Next, a number of examples of the bonding method of the present invention will be described.

EXAMPLE 1

Steel tubes having an outer diameter of 60 mm and a wall thickness of 7 mm were extruded to form forged tubes using six types of austenitic high temperature steels having the chemical compositions shown in Table 1.

Figure 1:
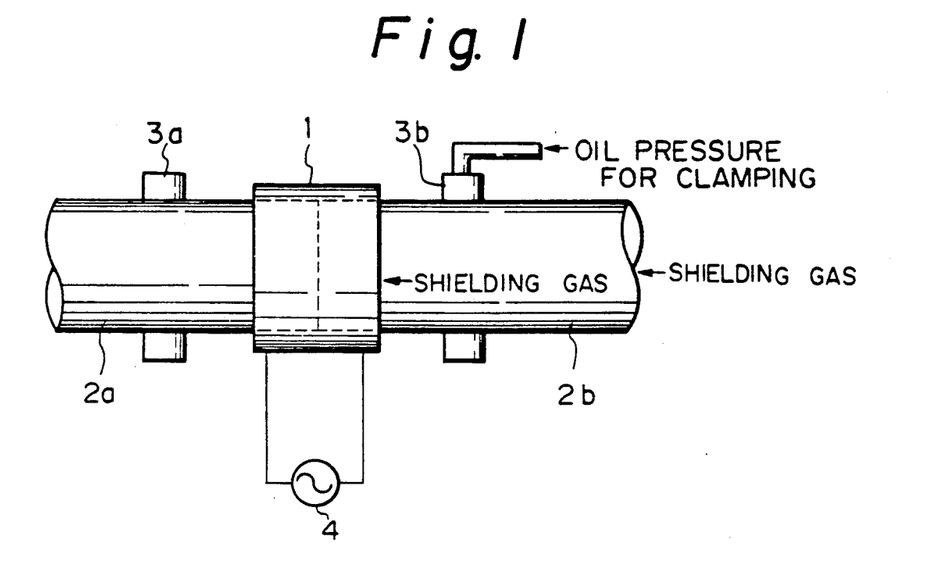
FIG. 1 is a schematic view of a bonding apparatus for carrying out the method of the present invention.

These steel tubes were bonded by the bonding method of the present invention in the manner shown in FIG. 1. Two of the tubes 2a and 2b were then secured by clamps 3a and 3b as shown in FIG. 1 with their ends confronting each other with an insert material therebetween inside a heating coil 1 that also served as a shield chamber.

All six types of forged tubes were for use at 700 degrees C. or above. The insert materials were flat, amorphous sheets formed by spraying a melt at the surface of rotating rollers and solidifying the melt by rapid cooling. Seven different types of insert materials having the chemical compositions shown in Table 2 were employed.

After the tubes 2a and 2b were secured in the clamps 3a and 3b, nitrogen gas was introduced into the shield chamber to adjust the oxygen concentration to 150 ppm or less. The heating coil 1 was then energized by a high-frequency power supply 4 to heat the ends of the tubes 2a and 2b. The heating of the ends of the tubes 2a and 2b caused their axial expansion, resulting in pressure being applied to the abutting surfaces of the ends. The pressure on the ends of the tubes 2a and 2b was varied by changing the compliance or the positions of the clamps 3a and 3b, and the heating temperature was adjusted by controlling the high-frequency power supply 4.

After the tubes 2a and 2b were joined to one another, the soundness of the joint was evaluated by a corrosion resistance test, a side bending test, and a creep test.

In the corrosion resistance test, specimens were immersed in carbon powder for 100 hours at 1100 degrees C., after which the depth of corrosion in cross sections of the specimens was measured.

Figure 2A:
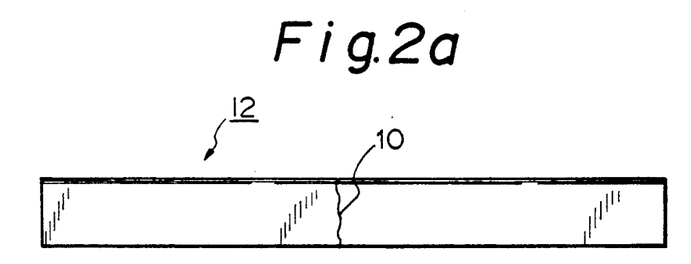
FIGS. 2a and 2b are schematic illustrations of a test specimen for a side bending test.
Figure 2B:
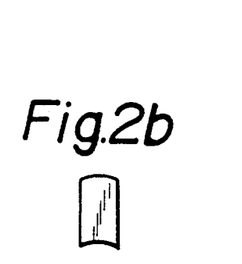

The side bending test was carried out using a test specimen like that shown in FIGS. 2a, 2b. The test specimen 12 (6 mm thick × 140 mm long) having a joint 10 was bent laterally (about an axis parallel to the lateral surfaces of the test specimen) by 180 degrees with a bending radius equal to twice the thickness of the test specimen and was then observed for the presence of cracks.

Figure 3:
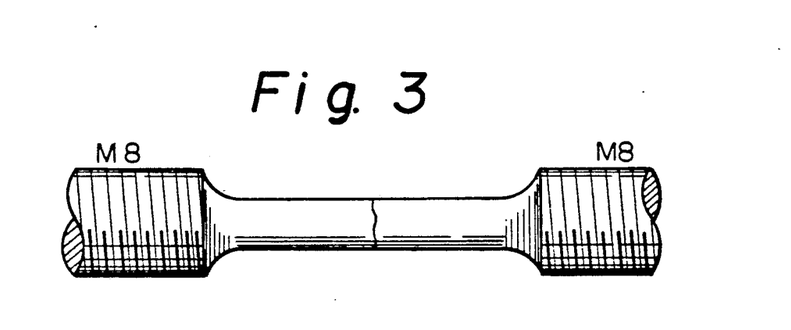
FIG. 3 is a schematic illustration of a creep test specimen.

The creep test was carried out using a test specimen like the one illustrated in FIG. 3. The test conditions, which are shown in Table 3, depended on the composition of the steel tube. Creep strength was evaluated as the time until creep rupture.

The test results and bonding conditions are shown in Table 4. Corrosion resistance was evaluated by the ratio of the depth of the corrosion of the joint to that of the base metal. A value of $1.0 \pm 0.2$ indicates corrosion resistance equivalent to that of the base metal. The results of the side bending test are indicated by a CIRCLE (no cracks) or by an X (cracks present). The creep strength is expressed as the ratio of the creep rupture time of the test specimen to the creep rupture time of the base metal.

As shown by Table 4, when bonding is carried out by the method of the present invention, in each case, the joint had excellent corrosion resistance, and no cracks were produced in the side bending test. Furthermore, in Run No. 22, the corrosion resistance of the joint greatly decreased when the thickness of the insert material was greater than 80 micrometers. In Run No. 21, when the pressure was greater than 2 kgf/mm$^2$, the joint was greatly deformed. It was confirmed that the joint had excellent high temperature strength, as evidenced by a creep rupture time of at least 80% of that of the base metal. In contrast, in Run No. 14 (Comparative Example), in which the insert material had a suitable composition but was excessively thick, the creep strength and corrosion resistance decreased. In Run Nos. 15, 16, and 19, the bonding temperature, the bonding time, or the applied pressure, respectively, were inadequate. Therefore, even though the other conditions were appropriate, the resulting joints were poor. In Run Nos. 17 and 20, the melting point of the insert material was too high. When the bonding temperature was 1200 degrees C. (Run No. 17), the insert material did not adequately melt and diffuse, and cracks formed during the side bending test. On the other hand, when the heating temperature was elevated high enough to melt the insert material (Run No. 20), hot cracks formed in the base metal. In Run No. 18, the melting point of the insert material was low, but the Cr content was too low, so even though bonding could be carried out, rupture took place after a short length of time due to high temperature oxidation during the creep test.

EXAMPLE 2

Clad steel tubes having an outer diameter of 91 mm, an inner diameter of 67 mm, a wall thickness of 12 mm, and a length of 1500 mm were employed. Two types of clad steel tubes were employed: internally clad steel tubes having the cladding material on the inside of the tube and externally clad steel tubes having the cladding material on the outside.

The base metal of each clad steel tube had a thickness of 9 mm and was made of carbon steel (Steel No. 7 in Table 5) or low alloy steel (Steel No. 8). The carbon steel had a strength of 50 kgf/mm$^2$, and the low alloy steel was $2\frac{1}{4}$ Cr -1 Mo steel. The cladding material was stainless steel or high Ni alloy steel of a thickness of 3 mm. The stainless steel was SUS316L (Steel No. 9), and the high Ni alloy steel was Alloy 825 (Steel No. 10) or Alloy 625 (Steel No. 11). The composition of each steel is shown in Table 5.

In order to join the tubes, each tube was first cut along a plane perpendicular to its longitudinal axis to form a flat end surface, and then the end surfaces of the cut tubes were ground to a maximum radius of 50 micrometers. An insert material was then disposed between the ends of two tubes and bonding was carried out. The insert material was a thin strip of a non-crystalline, i.e., amorphous alloy having a thickness of 25 or 120 micrometers and formed by the rapid cooling method. The composition of the insert material is shown in Table 6. Bonding of pairs of tubes was carried out using the arrangement illustrated in FIG. 1 in the same manner as in Example 1.

Figure 4A:
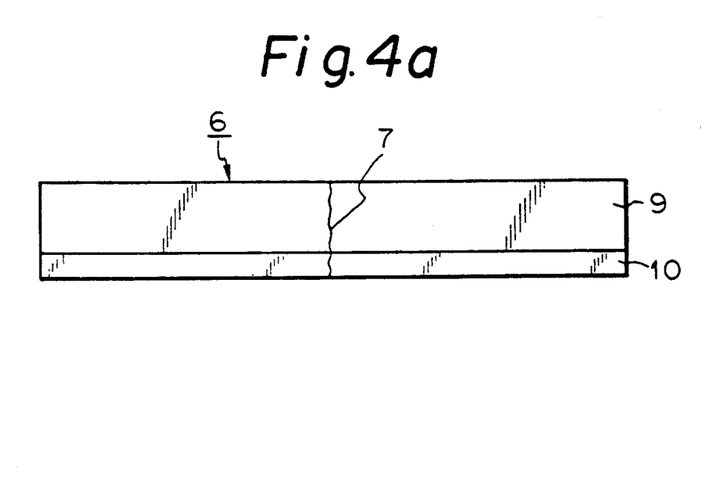
FIGS. 4a and 4b are schematic illustrations of a side bending test specimen.
Figure 4B:
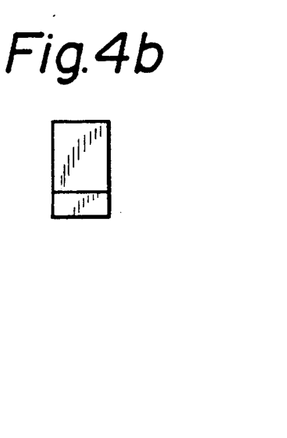

The joint strength was evaluated by a side bending test. A test specimen 6 like the one shown in FIGS. 4a, and 4b was bent by 180 degrees with a bending radius of 14 mm (twice the thickness of the test specimen) and the presence of cracks in the vicinity of the joint 7 was investigated.

In FIGS. 4a, 4b, 5a, and 5b, 9 indicates the base metal and 10 indicates the cladding material. A test specimen was considered satisfactory if no cracks were formed.

Figure 5A:
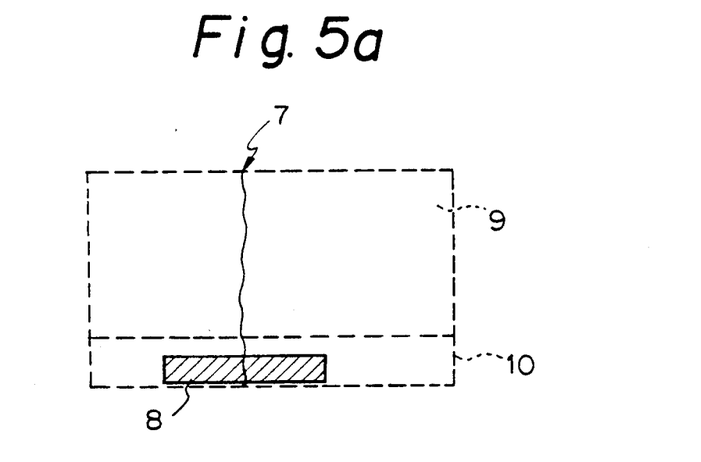
FIGS. 5a and 5b are schematic illustrations of a pitting test specimen.
Figure 5B:
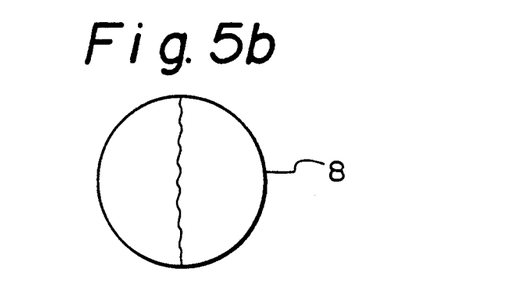

The corrosion resistance of the joint 7 was evaluated by a corrosion test using a pitting corrosion test specimen 8 machined from the cladding material of a tube, as shown in FIGS. 5a and 5b. The pitting potential was measured by scanning the potential using a potentiostat. The ratio of the pitting potential V'cj of the joint to the pitting potential V'cb of the cladding material of the clad steel tube was determined. The test solution was synthetic sea water. The test temperature was 60 degrees C. for SUS316L and 100 degrees C. for Alloy 625 and Alloy 825.

The test results are shown in Table 7.

In Run Nos. 23-30 and Nos. 35-42 clad steel tubes having an outer tube of carbon steel and an inner tube of SUS316L were joined using inserts Nos. 8-14. Inserts Nos. 8-14 included 5-40% of Cr and one or more of Si (at most 8%) and B (at most 4%). The other conditions were within the ranges prescribed for the present invention. Each of these examples had excellent joint strength and corrosion resistance.

In Run Nos. 31 and 43, internally clad steel tubes having an outer tube of low alloy steel and an inner tube of SUS316L were bonded using insert 12. The other conditions were as defined by the present invention, and the resulting joint had excellent strength and corrosion resistance.

In Run Nos. 32 and 44, internally clad steel tubes having an outer tube of carbon steel and an inner tube of a high Ni alloy steel in the form of Alloy 825 were joined by insert No. 9. In Run Nos. 33 and 45, internally clad steel tubes having an outer tube of carbon steel and an inner tube of a high Ni alloy steel in the form of Alloy 625 were joined by insert No. 11. In Run Nos. 34 and 46, internally clad steel tubes having an outer tube of low alloy steel and an inner tube of Alloy 625 were joined using insert No. 11. In Run Nos. 47 and 48, externally clad steel tubes having an outer tube of SUS316L and an inner tube of carbon steel were joined using insert No. 9. In each case, the insert had a thickness of 25 micrometers, the heating time was 300 seconds, the applied pressure was 1 kgf/mm², and the heating frequency was within the range defined by the present invention. The resulting joints had excellent strength and corrosion resistance.

In Run No. 49, internally clad steel tubes with an outer tube of carbon steel and an inner tube of SUS316L were joined using insert No. 9. Although the heating temperature was raised to 1250 degrees C., the resulting joint had excellent strength and corrosion resistance.

In contrast, in Run No. 50, an insert material was not used, so the resulting joint was poor. In Run No. 51, a suitable insert material was used, but the heating temperature was too low, so the resulting joint was poor. In Run No. 52, the applied pressure was too low, so again a poor joint was obtained.

In Run Nos. 53, 54, and 55, the composition of the insert material was outside the range defined for the present invention, so the resulting joints were poor.

In Run Nos. 57 and 58, the thickness of the insert was greater than 80 micrometers, so the corrosion resistance greatly decreased. Furthermore, in Run No. 56, the applied pressure was too large, so the joint was greatly deformed, and cracks formed in the joint.

Although the invention has been described with preferred embodiments it is to be understood that variations and modifications may be employed without departing from the concept of the invention as defined in the following claims.

TABLE 1

| Steel Tube No. | C | Si | Mn | P | S | Ni | Cr | Mo | Ti | B | Zr | Fe (wt %) |
|---|---|---|---|---|---|---|---|---|---|---|---|---|
| 1 | 0.16 | 1.79 | 1.01 | 0.013 | 0.002 | 38.69 | 24.46 | 2.03 | 0.40 | 0.0053 | 0.030 | Bal. |
| 2 | 0.13 | 1.72 | 1.02 | 0.009 | 0.002 | 34.48 | 24.06 | — | 0.38 | 0.0046 | 0.028 | " |
| 3 | 0.25 | 1.39 | 1.10 | 0.017 | 0.001 | 24.73 | 24.95 | — | 0.40 | 0.0037 | — | " |
| 4 | 0.08 | 1.36 | 0.35 | 0.013 | 0.009 | 33.05 | 22.52 | — | 0.41 | — | — | " |
| 5 | 0.50 | 2.00 | 0.97 | 0.009 | 0.007 | 35.16 | 25.21 | — | — | — | — | " |
| 6 | 0.36 | 1.05 | 1.03 | 0.013 | 0.007 | 20.01 | 25.36 | — | — | — | — | " |

TABLE 2

| Insert Material No. | Chemical Composition (wt %) | | | | | | Melting Point (°C.) |
|---|---|---|---|---|---|---|---|
| | Cr | Si | B | Mo | Ni | Fe | |
| 1 | 19 | 7.5 | 1.5 | — | 72 | — | 1140 |
| 2 | 6 | 4 | 4 | — | 86 | — | 1100 |
| 3 | 7 | 3 | 3 | 3 | 84 | — | 1140 |
| 4 | 10 | — | 4 | — | 86 | — | 1140 |
| 5 | 15 | 4 | 3 | — | — | 78 | 1100 |
| 6 | 2* | 7 | 1.5 | — | 89.5 | — | 1130 |
| 7 | 10 | 2.5 | 0 | — | 87.5 | — | 1260* |

Note
*Outside of the present invention.

TABLE 3

| Steel Tube No. | Testing Temperature (°C.) | Applied Stress (kgf/mm²) |
|---|---|---|
| 1 | 1050 | 1.5 |
| 2 | " | " |
| 3 | " | " |
| 5 | " | " |
| 6 | " | " |
| 4 | 900 | 2 |

TABLE 4

| | Run No. | Steel Tube No. | Insert Material No. | Insert Material Thickness (μm) | Bonding Temperature (°C.) | Bonding Time (S) | Applied Pressure (kgf/mm²) | Frequency (kHz) | Corrosion Test (Corrosion depth)** | Side Bending Test | Creep Rupture Time*** |
|---|---|---|---|---|---|---|---|---|---|---|---|
| Present | 1 | 1 | 1 | 30 | 1250 | 150 | 1 | 5 | 1.1 | ○ | 0.92 |
| Invention | 2 | " | " | " | 1200 | 300 | " | " | 1.0 | ○ | 0.82 |
| | 3 | " | " | 70 | 1250 | " | 2 | " | 1.1 | ○ | 0.81 |

TABLE 4-continued

|  | Run No. | Steel Tube No. | Insert Material No. | Insert Material Thickness (μm) | Bonding Temperature (°C.) | Bonding Time (S) | Applied Pressure (kgf/mm²) | Frequency (kHz) | Corrosion Test (Corrosion depth)** | Side Bending Test | Creep Rupture Time*** |
|---|---|---|---|---|---|---|---|---|---|---|---|
|  | 4 | 2 | " | 30 | " | " | 1 | " | 0.9 | ○ | 0.93 |
|  | 5 | 3 | " | " | " | " | " | " | 1.1 | ○ | 0.84 |
|  | 6 | 4 | " | " | " | " | " | " | 1.0 | ○ | 0.85 |
|  | 7 | 5 | " | " | 1180 | " | " | " | 1.1 | ○ | 0.83 |
|  | 8 | 6 | " | " | " | " | " | " | 1.1 | ○ | 0.83 |
|  | 9 | 1 | " | " | 1200 | " | " | " | 0.9 | ○ | 0.90 |
|  | 10 | " | 2 | " | " | " | " | " | 1.1 | ○ | 0.92 |
|  | 11 | 3 | 3 | " | " | " | " | " | 1.1 | ○ | 0.93 |
|  | 12 | 1 | 4 | " | 1250 | " | " | 15 | 1.0 | ○ | 0.91 |
|  | 13 | " | 5 | " | " | " | " | 15 | 0.9 | ○ | 0.89 |
| Comparative | 14 | 1 | 1 | 120* | 1200 | 300 | 1 | 5 | 2.1 | ○ | 0.52 |
|  | 15 | " | " | 30 | 1100* | " | " | " | — | X | — |
|  | 16 | " | " | " | 1200 | 60* | " | " | — | X | — |
|  | 17 | " | 7* | " | " | 300 | " | " | — | X | — |
|  | 18 | " | 6* | " | " | " | " | " | — | X | — |
|  | 19 | " | 1 | " | " | " | —* | " | — | X | — |
|  | 20 | " | 7* | " | 1300* | " | 1 | " | — | X | — |
|  | 21 | " | 1 | " | 1200 | " | 3* | " | — | X (crack) | — |
|  | 22 | " | " | 100* | " | " | 1 | " | 1.6 | ○ | — |

Note:
*Outside of the present invention
**Ratio (joint/base)
***Ratio (joint/base)

TABLE 5

(wt %)

| Steel Tube No. | C | Si | Mn | P | S | Ni | Cr | Mo | Ti | Nb | Fe | |
|---|---|---|---|---|---|---|---|---|---|---|---|---|
| 7 | 0.09 | 0.24 | 1.13 | 0.013 | 0.004 | 0.09 | 0.06 | 0.01 | — | — | Bal. | Carbon steel |
| 8 | 0.08 | 0.35 | 0.76 | 0.021 | 0.002 | 0.01 | 2.3 | 0.98 | — | — | " | Low alloy steel |
| 9 | 0.02 | 0.45 | 0.87 | 0.021 | 0.001 | 12.4 | 16.3 | 2.4 | — | — | " | Stainless steel |
| 10 | 0.02 | 0.53 | 0.67 | 0.018 | 0.001 | 42.3 | 22.3 | 3.6 | 1.30 | — | " | Ni base alloy |
| 11 | 0.02 | 0.32 | 0.45 | 0.015 | 0.001 | 59.3 | 21.4 | 8.7 | 0.34 | 3.52 | " |  |

TABLE 6

| Insert Material No. | Chemical Composition (wt %) | | | | | | Melting Point (°C.) |
|---|---|---|---|---|---|---|---|
|  | Si | B | Cr | Mo | Fe | Ni |  |
| 8 | 4 | 4 | 6 | — | — | 86 | 1100 |
| 9 | 7.5 | 1.5 | 19 | — | — | 72 | 1140 |
| 10 | 7.8 | 2 | 6 | — | — | 84.2 | 1130 |
| 11 | 3 | 3 | 6 | 7 | 81 | — | 1120 |
| 12 | 4 | 4 | 6 | — | 86 | — | 1140 |
| 13 | — | 4 | 10 | — | — | 86 | 1140 |
| 14 | 4 | 3 | 15 | — | 78 | — | 1100 |
| 15 | 10* | —* | —* | — | 90 | — | 1130 |
| 16 | —* | 10* | —* | — | — | 90 | 1100 |
| 17 | —* | 2.5 | —* | — | — | 97.5 | 1260* |

Note:
*Outside of the present invention.

TABLE 7 (1)

| Run No. | Test Tube No. Outer Tube | Test Tube No. Inner Tube | Insert Material No. | Thickness (μm) | Bonding Temperature (°C.) | Bonding Time (S) | Applied Pressure (kgf/mm²) | Frequency (kHz) | Side Bending Test | Pitting Corrosion Potential (V˙cj/V˙cb) | Remarks |
|---|---|---|---|---|---|---|---|---|---|---|---|
| 23 | 7 | 9 | 8 | 25 | 1200 | 150 | 1 | 300 | ○(Good) | 0.86 | Present Invention |
| 24 | " | " | 9 | " | " | " | " | " | ○ | 0.87 | Invention |
| 25 | " | " | 10 | " | " | " | " | " | ○ | 0.85 |  |
| 26 | " | " | 11 | " | " | " | " | 250 | ○ | 0.86 |  |
| 27 | " | " | 12 | " | " | " | " | " | ○ | 0.82 |  |
| 28 | " | " | 13 | " | " | " | " | " | ○ | 0.87 |  |
| 29 | " | " | 14 | " | 300 | " | " | " | ○ | 0.86 |  |
| 30 | " | " | 11 | 50 | " | 150 | " | " | ○ | 0.92 |  |
| 31 | 8 | " | 9 | 25 | " | " | " | " | ○ | 0.87 |  |
| 32 | 7 | 10 | 9 | " | " | 300 | " | 150 | ○ | 0.85 |  |
| 33 | " | 11 | 11 | " | " | " | " | " | ○ | 0.89 |  |
| 34 | 8 | " | 11 | " | " | " | " | " | ○ | 0.88 |  |
| 35 | 7 | 9 | 8 | " | " | 150 | " | 30 | ○ | 0.85 |  |
| 36 | " | " | 9 | " | " | " | " | " | ○ | 0.88 |  |
| 37 | " | " | 10 | " | " | " | " | " | ○ | 0.88 |  |
| 38 | " | " | 11 | " | " | " | " | 25 | ○ | 0.87 |  |
| 39 | " | " | 12 | " | " | " | " | " | ○ | 0.85 |  |
| 40 | " | " | 13 | " | " | " | " | " | ○ | 0.86 |  |
| 41 | " | " | 14 | " | " | 300 | " | " | ○ | 0.87 |  |
| 42 | " | " | 11 | 50 | " | 150 | " | " | ○ | 0.93 |  |

TABLE 7 (1)-continued

| Run No. | Test Tube No. Outer Tube | Test Tube No. Inner Tube | Insert Material No. | Thickness (μm) | Bonding Temperature (°C.) | Bonding Time (S) | Applied Pressure (kgf/mm²) | Frequency (kHz) | Side Bending Test | Pitting Corrosion Potential (V'cj/V'cb) | Remarks |
|---|---|---|---|---|---|---|---|---|---|---|---|
| 43 | 8 | " | 9 | 25 | " | " | " | " | C | 0.88 | |

TABLE 7 (2)

| Run No. | Test Tube No. Outer Tube | Test Tube No. Inner Tube | Insert Material No. | Thickness (μm) | Bonding Temperature (°C.) | Bonding Time (S) | Applied Pressure (kgf/mm²) | Frequency (kHz) | Side Bending Test | Pitting Corrosion Potential (V'cj/V'cb) | Remarks |
|---|---|---|---|---|---|---|---|---|---|---|---|
| 44 | 7 | 10 | 9 | 25 | 1200 | 300 | 1 | 15 | ○(Good) | 0.86 | Present |
| 45 | " | 11 | 11 | " | " | " | " | " | ○ | 0.90 | Invention |
| 46 | 8 | " | " | " | " | " | " | " | ○ | 0.89 | |
| 47 | 9 | 7 | 9 | " | " | " | " | 5 | ○ | 0.90 | |
| 48 | " | " | " | " | " | " | " | 1 | ○ | 0.90 | |
| 49 | 7 | 9 | " | " | 1250 | " | " | 300 | ○ | 0.82 | |
| 50 | 7 | 9 | None* | —* | 1200 | 150 | 1 | 300 | X | — | Comparative |
| 51 | " | " | 9 | 25 | 1100* | " | " | " | X | — | |
| 52 | " | " | " | " | 1200 | " | 0.1 | " | X | — | |
| 53 | " | " | 15* | " | " | " | 1 | " | X | — | |
| 54 | " | " | 16* | " | " | " | " | " | X | — | |
| 55 | " | " | 17* | " | " | " | " | " | X | — | |
| 56 | " | " | 9 | " | " | 300 | 3* | 15 | X (Crack) | — | |
| 57 | " | 10 | " | 100* | " | " | 1 | " | ○ | 0.50 | |
| 58 | " | 11 | " | 120* | " | " | " | " | C | 0.55 | |

Note
*Outside of the present invention.

What is claimed is:

1. A diffusion bonding method for corrosion resistant materials comprising:
    disposing an insert material having a melting point of at most 1150 degrees C. and a thickness of 10–80 micrometers between the bonding interfaces of two members to be joined, the insert comprising, by weight %,
    Cr: 5–40%,
    one or more of Si: at most 8% and B: at most 4%, and a remainder of at least one of Fe and Ni and incidental impurities; and
    heating the bonding interfaces of the two members by high-frequency induction heating for at least 120 seconds at a temperature of 1150–1250 degrees C. in an atmosphere containing at most 200 ppm oxygen while applying a pressure of 0.5–2 kgf/mm² to the bonding interfaces so as to melt the insert material.

2. A method as claimed in claim 1, wherein the bonding pressure is given by the application of external forces or by restraining thermal expansion of the materials being bonded.

3. A method as claimed in claim 1, wherein the insert further contains at most 10% Mo.

4. A method as claimed in claim 1, wherein the corrosion resistant materials to be joined are high-alloy corrosion resistant materials for use in high temperature equipment consisting essentially of, by weight %,
    C: 0.05–0.5%,
    Si: 1–2.5%,
    Mn: 0.1–1.5%,
    Ni: 20–45%,
    Cr: 22–30%, and
    a remainder of Fe and incidental impurities.

5. A method as claimed in claim 1, wherein the corrosion resistant materials to be joined are high-alloy corrosion resistant materials for use in high temperature equipment consisting essentially of, by weight %,
    C: 0.05–0.5%,
    Si: 1–2.5%,
    Mn: 0.1–1.5%,
    Ni: 20–45%,
    Cr: 22–30%,
    Mo: 1.8–2.2%,
    Ti: 0.2–0.8%
    B: 0.002–0.007%, Zr: 0.001–0.05%, and a remainder of Fe and incidental impurities.

6. A method as claimed in claim 4, wherein the frequency of the high-frequency heating is 2–20 kHz.

7. A method as claimed in claim 5, wherein the frequency of the high-frequency heating is 2–20 kHz.

8. A diffusion bonding method for corrosion resistant materials comprising:
    disposing an insert material having a melting point of at most 1150 degrees C. and a thickness of 10–80 micrometers between the bonding interfaces of two members to be joined, the insert comprising, by weight %,
    Cr: 5–40%,
    one or more of Si: at most 8% and B: at most 4%, and a remainder of at least one of Fe and Ni and incidental impurities; and
    heating the bonding interfaces of the two members by high-frequency induction heating for at least 120 seconds at a temperature of 1150–1250 degrees C. in an atmosphere containing at most 200 ppm oxygen while applying a pressure of 0.5–2 kgf/mm² to the bonding interfaces so as to melt the insert material, the materials to be joined comprising internally clad steel tubes comprising an outer tube of carbon steel of low alloy steel and an inner tube of stainless steel of high Ni alloy.

9. A diffusion bonding method for corrosion resistant materials comprising:
    disposing an insert material having a melting point of at most 1150 degrees C. and a thickness of 10–80 micrometers between the bonding interfaces of two members to be joined, the insert comprising, by weight %,
Cr: 5–40%,
one or more of Si: at most 8% and B: at most 4%, and
a remainder of at least one of Fe and Ni and incidental impurities; and
heating the bonding interfaces of the two members by high-frequency induction heating for at least 120 seconds at a temperature of 1150–1250 degrees C. in an atmosphere containing at most 200 ppm oxygen while applying a pressure of 0.5–2 kgf/mm² to the bonding interfaces so as to melt the insert material, the materials comprising externally clad steel tubes comprising an outer tube of stainless steel of high-Ni alloy steel and an inner tube of carbon steel of low alloy steel.

10. A method as claimed in claim 8, wherein the frequency of high-frequency heating is 2–400 kHz.

11. A method as claimed in claim 9, wherein the frequency of high-frequency heating is at most 10 kHz.

12. A diffusion bonding method for corrosion-resistant, clad materials comprising:
disposing an insert material between the bonding interfaces of said clad materials, the insert material having the following composition, by weight %,
Cr: 5–40%,
Mo: at most 10%
one or more of Si: at most 8% and B: at most 4%, and
a remainder of at least one of Fe and Ni and incidental impurities; and
the clad material being a high Ni alloy clad material or a stainless steel clad material, the high Ni alloy having the following composition by weight %:
C: 0.05–0.5%,
Si: 1–2.5%,
Mn: 0.1–1.5%,
Ni: 20–45%,
Cr: 22–30%,
optionally one or more of Mo: 1.8–2.2%,
Ti: 0.2–0.8%
B: 0.002–0.007%, and Zr: 0.001–0.05%, and a remainder of Fe and incidental impurities,
heating the bonding interfaces of said clad materials by high-frequency induction heating of 2–400 kHz at a temperature of 1150°–1250°C. in an atmosphere containing at most 200 ppm oxygen while applying a pressure of 0.5–2 kgf/mm² to the bonding interfaces so as to melt the insert material.

13. A method as claimed in claim 12, wherein the corrosion resistant materials to be joined are high-alloy corrosion resistant materials for use in high temperature equipment consisting essentially of, by weight %,
C: 0.05–0.5%,
Si: 1–2.5%,
Mn: 0.1–1.5%,
Ni: 20–45%,
Cr: 22–30%, and
a remainder of Fe and incidental impurities.

14. A method as claimed in claim 12, wherein the resistant materials to be joined are high-alloy corrosion resistant materials for use in high temperature equipment consisting essentially of, by weight %,
C: 0.05–0.5%,
Si: 1–2.5%,
Mn: 0.1–1.5%,
Ni: 20–45%,
Cr: 22–30%,
Mo: 1.8–2.2%,
Ti: 0.2–0.8%,
B: 0.002–0.007%,
Zr: 0.01–0.05%, and
a remainder of Fe and incidental impurities.

15. A method as claimed in claim 13, wherein the frequency of the high-frequency heating is 2–20 kHz.

16. A method as claimed in claim 14, wherein the frequency of the high-frequency heating is 2–20 kHz.

17. A diffusion bonding method for corrosion resistant materials comprising:
disposing an insert material having a melting point of at most 1150 degrees C. and a thickness of 10–80 micrometers between the bonding interfaces of two members to be joined, the insert comprising, by weight %,
Cr: 5–40%,
Mo: at most 10%,
one or more of Si: at most 8% and B: at most 4%, and
a remainder of at least one of Fe and Ni and incidental impurities; and
heating the bonding interfaces of the two members by high-frequency induction heating for at least 120 seconds at a temperature of 1150–1250 degrees C. in an atmosphere containing at most 200 ppm oxygen while applying a pressure of 0.5–2 kgf/mm² to the bonding interfaces so as to melt the insert material, the materials to be joined comprising internally clad steel tubes comprising an outer tube of carbon steel or low alloy steel and an inner tube of stainless steel or high Ni alloy.

18. A diffusion bonding method for corrosion resistant materials comprising:
disposing an insert material having a melting point of at most 1150 degrees C. and a thickness of 10–80 micrometers between the bonding interfaces of two members to be joined, the insert comprising, by weight %,
Cr: 5–40%,
Mo: at most 10%,
one or more of Si: at most 8% and B: at most 4%, and
a remainder of at least one of Fe and Ni and incidental impurities; and
heating the bonding interfaces of the two members by high-frequency induction heating for at least 120 seconds at a temperature of 1150–1250 degrees C. in an atmosphere containing at most 200 ppm oxygen while applying a pressure of 0.5–2 kgf/mm² to the bonding interfaces so as to melt the insert material, the materials to be joined comprising internally clad steel tubes comprising an outer tube of stainless steel or high Ni alloy steel and an inner tube of carbon steel or low alloy steel.

19. A method as claimed in claim 17, wherein the frequency of high-frequency heating is 2–400 kHz.

20. A method as claimed in claim 18, wherein the frequency of high-frequency heating is at most 10 kHz.

21. A joint obtained by the diffusion bonding method set forth in claim 1.

22. A joint obtained by the diffusion bonding method set forth in claim 8.

23. A joint obtained by the diffusion bonding method set forth in claim 9.

24. A joint obtained by the diffusion bonding method set forth in claim 12.

25. A joint obtained by the diffusion bonding method set forth in claim 17.

26. A joint obtained by the diffusion bonding method set forth in claim 18.

* * * * *